United States Patent [19]
Choudhury et al.

[11] Patent Number: 5,053,843
[45] Date of Patent: Oct. 1, 1991

[54] THERMALLY-STABLE STRUCTURE FOR IMSM PHOTODETECTORS ON GAAS SUBSTRATES

[75] Inventors: A. N. M. Masum Choudhury, West Newton; Chirravuri Jagannath, Medfield; Boris S. Elman, Newton; Craig A. Armiento, Acton, all of Mass.

[73] Assignee: GTE Laboratories Incorporated, Waltham, Mass.

[21] Appl. No.: 626,159

[22] Filed: Dec. 12, 1990

[51] Int. Cl.$^5$ .................. H01L 29/205; H01L 27/14; H01L 31/06
[52] U.S. Cl. .......................... 357/30; 357/4; 357/16; 357/22; 357/15
[58] Field of Search ............... 357/4, 16, 22, 30, 15

[56] References Cited
PUBLICATIONS

Hong et al., *IEEE Trans. on Elec. Dev.*, vol. 36, No. 4, Apr. 89, pp. 659–662, "High-Performance . . . OMCVD".

Wada et al., *Appl. Phys. Letter*, 54(1), Jan, 2, 1989, "Very High Speed GaInAs . . . Superlattice", pp. 16–17.
Abrokwah et al., *J. Vac. Sci. Technol.*, B4(2), Mar./Apr. 86, "Novel Self-Aligned . . . Transistors", pp. 615–617.

*Primary Examiner*—Jerome Jackson, Jr.
*Attorney, Agent, or Firm*—Victor F. Lohmann, III

[57] ABSTRACT

An IMSM photodetector structure comprises a GaAs substrate, a buffer region grown on the substrate, an optically active absorbing layer of $In_{0.42}Ga_{0.58}As$ grown on the absorbing layer. The buffer region includes in sequence a first layer of $In_{0.23}Ga_{0.77}As$, an $In_{0.46}Ga_{0.54}As$/GaAs superlattice, and a second layer of $In_{0.23}Ga_{0.77}As$. An interdigitated pattern of Schottky metal contacts is fabricated on the $Al_{0.3}Ga_{0.7}As$/GaAs superlattice. This structure is useful in fabricating long-wavelength, monolithic receivers based on GaAs MESFET technology since the optical and electrical characteristics of the structure are preserved during the thermal annealing cycle necesary in ion-implaned GaAs MESFET processes.

9 Claims, 6 Drawing Sheets

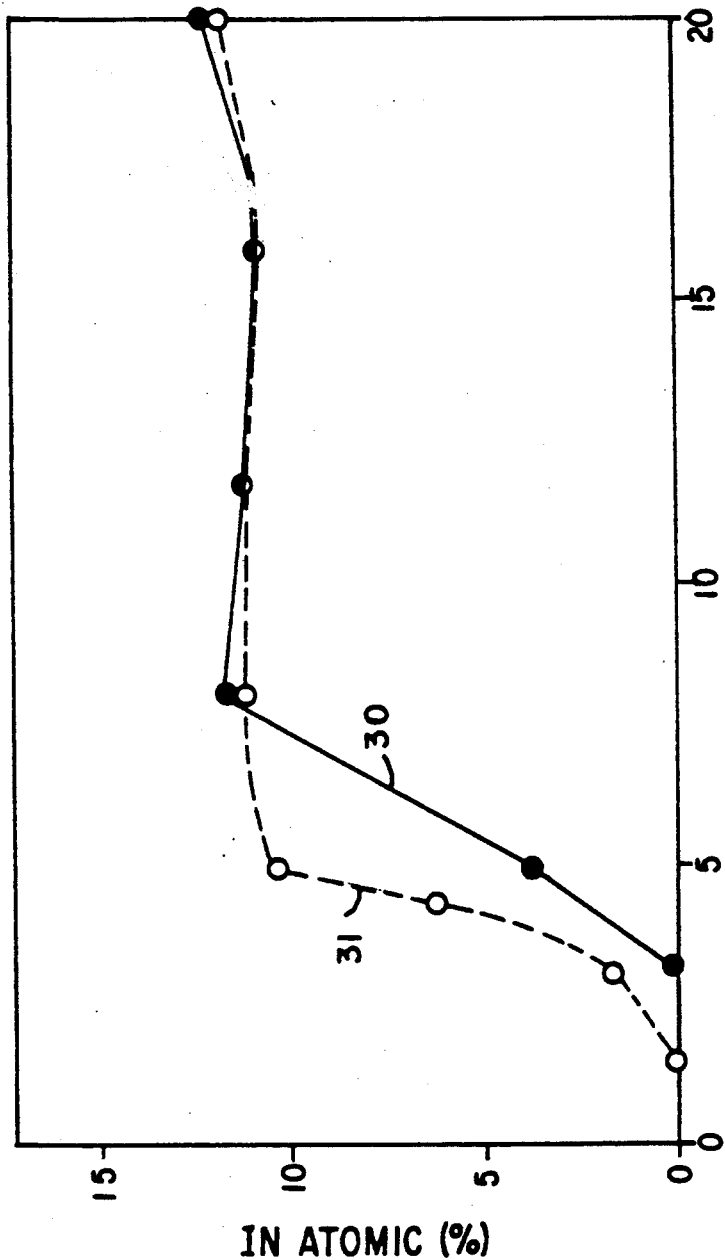

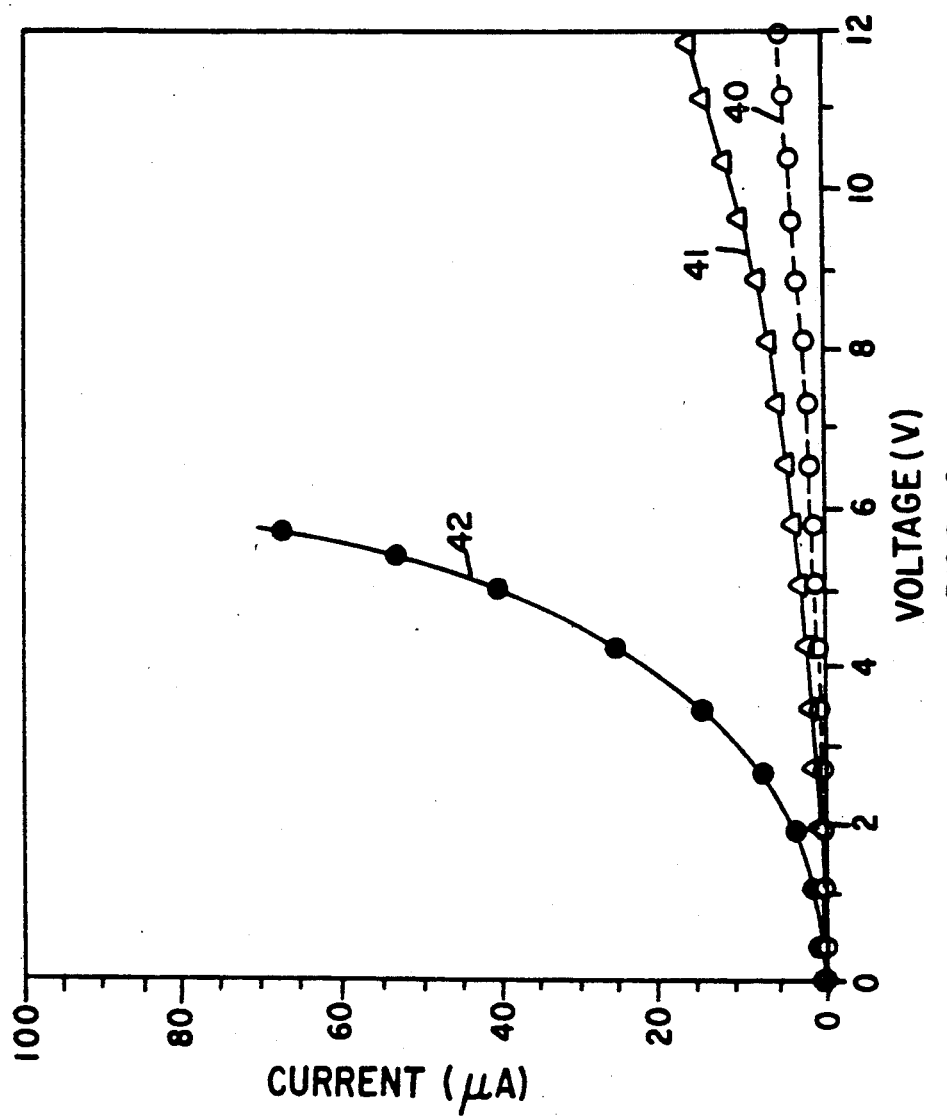

THERMALLY-STABLE STRUCTURE FOR IMSM PHOTODETECTORS ON GAAS SUBSTRATES

FIELD OF THE INVENTION

This invention relates to semiconductor device structures and, more particularly, to Schottky-based interdigitated metal-semiconductor-metal (IMSM) photodetectors.

BACKGROUND OF THE INVENTION

The development of InGaAs photodetectors has received considerable attention in recent years for long-haul applications in the 1.3 to 1.6 μm region of the spectrum. One type of structure that has been investigated is the interdigitated-metal-semiconductor-metal (IMSM) photodetector, which has a planar geometry and simple process that is attractive for monolithic integration with electronic circuits. InGaAs/InP IMSM photodetectors have been demonstrated with good performance and integrated with simple InP-based electronic circuits. The relative immaturity of InP-based electronics, however, has motivated photodetector research to investigate growing InGaAs on GaAs substrates, which offers the potential of exploiting manufacturing-based GaAs electronics technology. One issue that will determine the viability of this approach is the process compatibility of the photodetector and the electronic components.

Commercial GaAs IC technology, which is based on the metal-semiconductor field-effect transistor (MESFET), is typically fabricated by an ion implantation process that requires a high-temperature anneal step. Fabrication of an InGaAs/GaAs monolithic receiver will, therefore, require that the photodetector material be capable of withstanding the high temperature anneal without degradation of its optical and electrical properties.

InGaAs IMSM structures are generally fabricated with a thin cap layer of a large bandgap material, such as GaAs, AlGaAs or InAlAs to enhance the low Schottky barrier height (~0.3 eV) between the InGaAs and most metals. Two such structures were disclosed by Razeghi et al. in "Planar Monolithic integrated photoreceiver for 1.3-1.55 μm wavelength applications using GaInAs-GaAs heteroepitaxies," Appl. Phys. Lett. Vol. 49, by et (1986)'Ga$_{0.47}$In$_{0.53}$As field-effect transistors with a lattice-mismatched reduced leakage current GaAs gate," Electron. Lett. Vol. 22, No. 5, p. 236 (1986).

Rogers et al. in "High Speed 1.3 μm GaInAs Detectors Fabricated on GaAs Substrates," IEEE Electron Device Lett. 9, 515 (1988) demonstrated a four-layer IMSM photodetector grown by MBE with a 500Å graded (In$_x$Ga$_{1-x}$As, x=0.4 to 0) GaAs cap layer. The first layer was a 0.5 μm GaAs buffer layer followed by a 0.5 μm of In$_{0.25}$Ga$_{0.75}$As layer. Next, a 1 μm In$_{0.4}$Ga$_{0.6}$As absorbing layer was grown having a final GaAs thin (300Å-500Å) capping layer on top to enhance the Schottky barrier height of the IMSMs. When these layers are subjected to a high temperature annealing cycle, either in a furnace or in an RTA system as is required in ion-implanted GaAs MESFET processes, indium diffuses out from the absorbing (In$_{0.4}$Ga$_{0.6}$As) layer towards the surface. Indium diffusion disadvantageously shifts the absorption wavelength of the active layer (In$_{0.4}$Ga$_{0.6}$As) as well as degrades the Schottky barriers fabricated on this material. Thus, the annealing process results in a large increase in the photo-detector dark current compared to those fabricated on unannealed material.

OBJECTS OF THE INVENTION

It is a principal object of the present invention to obviate the above-noted and other disadvantages of the prior art.

It is another object of the present invention to provide a novel photodetector structure that is process compatible with GaAs IC technology.

It is another object of the present invention to provide a novel long-wavelength IMSM photodetector structure based on a superlattice cap layer that preserves the optical and electrical properties of the structure after high temperature annealing, thus offering the potential for monolithic integration with ion implanted GaAs MESFETS.

SUMMARY OF THE INVENTION

The present invention is directed to a photodetector structure comprising a substrate, a buffer region grown on the substrate, an optically active absorbing layer grown on the buffer region, and an upper superlattice structure grown on the absorbing layer. The buffer region includes in sequence a first semiconducting layer, a superlattice structure, and a second semiconducting layer. An interdigitated pattern of Schottky metal contacts on the upper superlattice structure.

BRIEF DESCRIPTION OF THE DRAWINGS

FIG. 3A shows the depth profile of atomic percent of indium for as-grown and thermally annealed samples fabricated in accordance with the structure of FIG. 1;

FIG. 4 shows the dark current verses bias voltage (I-V) curves for various IMSM photodetector structures.

DETAILED DESCRIPTION OF THE PREFERRED EMBODIMENTS

In accordance with the present invention, a novel photodetector structure includes in sequence a substrate, a buffer region, an optically active absorbing layer, and an upper superlattice structure grown on the absorbing layer. Metal Schottky contacts are fabricated on the superlattice. Although other suitable material systems and fabrication processes may be used as is well known to those skilled in the art, the above-described structure can be fabricated by molecular beam epitaxy using an InGaAs/GaAs material system whereby the substrate is GaAs, the absorbing layer is In$_x$Ga$_{1-x}$As, the buffer region includes a first layer of In$_{x1}$Ga$_{1-x1}$As, an In$_{x2}$Ga$_{1-x2}$As/GaAs superlattice, and a second layer of In$_{x1}$Ga$_{1-x1}$As (x$_1$<x<x$_2$), and the upper super lattice includes Al$_y$Ga$_{1-y}$As/GaAs.

Figure 1:
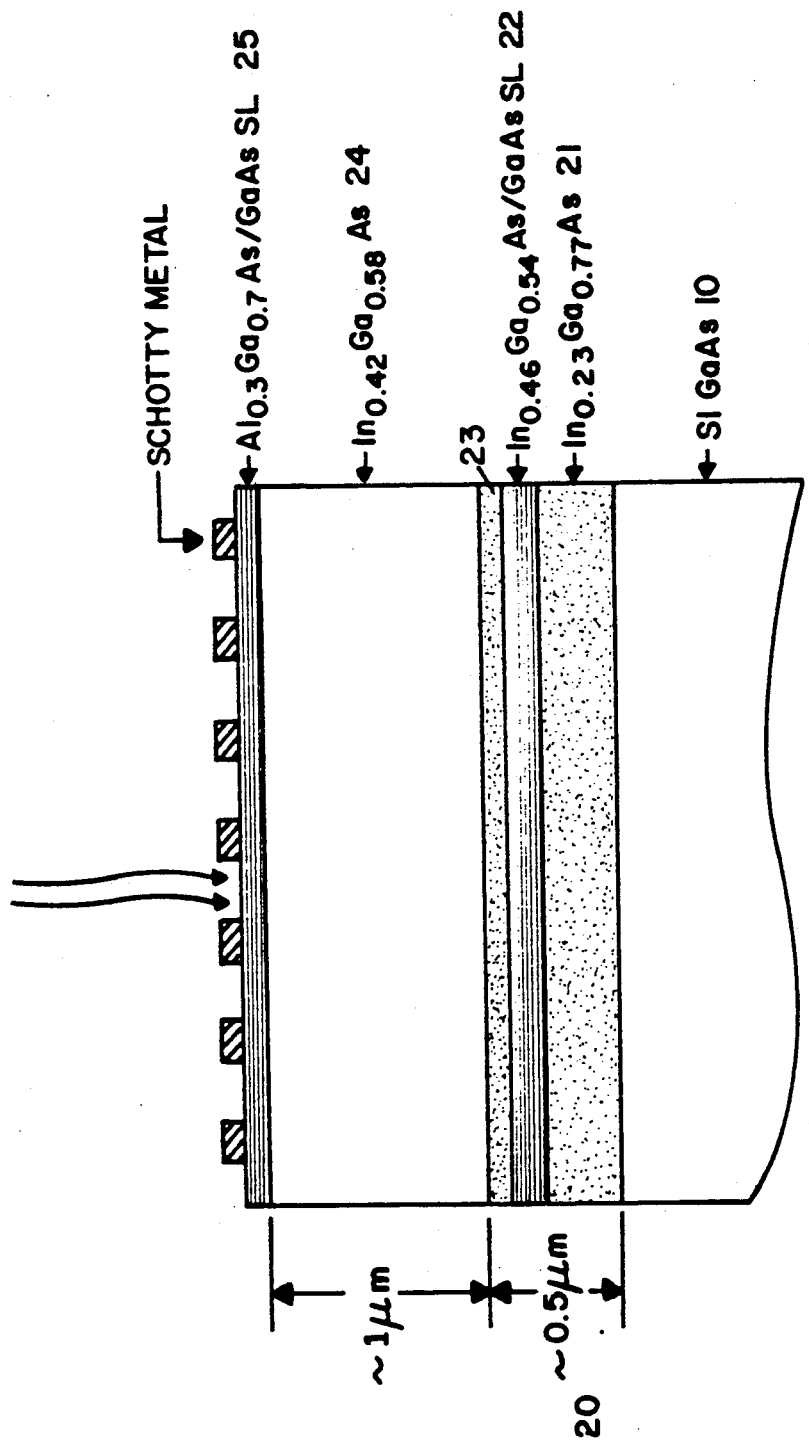
FIG. 1 shows an IMSM photodetector layer structure fabricated in accordance with the present invention.

FIG. 1 shows a specific photodetector device structure fabricated by molecular beam epitaxy (MBE) in accordance with the present invention where $x_1=0.23$, $x=0.42$, $x_2=0.46$, and $y=0.3$. The photodetector structure consists of a semi-insulating GaAs substrate 10 upon which is grown an approximately 0.5 μm thick buffer region 20. The buffer region 20 includes in sequence a first buffer layer 21 of $In_{0.23}Ga_{0.77}As$, a superlattice 22 consisting of 20 periods of 10Å $In_{0.46}Ga_{0.54}As$/10Å GaAs, and a second buffer layer 23 of $In_{0.23}Ga_{0.77}As$. The superlattice structure 22 reduces the propagation of dislocations from the lattice mismatched interface between the substrate 10 and the first buffer layer 21.

An approximately 1 μm-thick optically absorbing active region 24 consisting of $In_{0.42}Ga_{0.58}As$ is grown over the second buffer layer 23. An $Al_{0.3}Ga_{0.7}As$/GaAs superlattice 25 (10 periods-25Å/25Å) is grown over the active region to enhance the Schottky barrier and to impede the diffusion of indium to the surface during the high-temperature annealing cycle necessary in the fabrication of a InGaAs/GaAs monolithic receiver circuit. Dark current, dc responsivity, and high frequency response data of two photodetector structures fabricated on both as-grown and annealed material are presented below.

Early experiments with capless furnace annealing (850° C./30 min.) on graded GaAs cap structures, such as the aforementioned Rogers et al. device, yielded significant degradation of optical and electrical properties of the IMSM photodetectors fabricated from these materials. The preferred heat treatment, therefore, to evaluate the stability of the grown sample structure is rapid thermal annealing.

Figure 2:
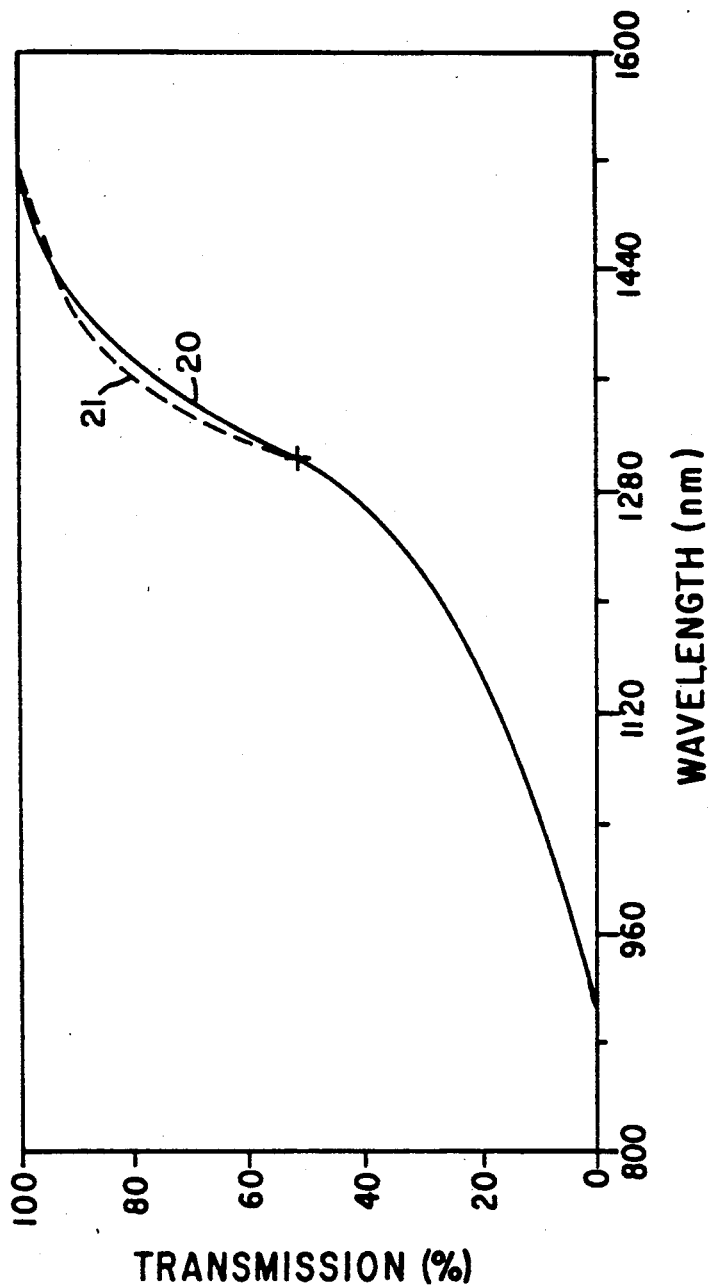
FIG. 2 graphically illustrates the room temperature optical transmission characteristics of the device in FIG. 1 for both as-grown and annealed samples.

Rapid thermal annealing of the structure in FIG. 1 was performed in an AG Heatpulse 410 RTA system at 930° C. for 10 s, using the enhanced overpressure proximity (EOP) technique discussed by Armiento and Prince in "Capless RTA of GaAs using an enhanced overpressure proximity technique," Appl. Phys. Lett., Vol. 48, No. 23, p. 1623 (1986). This is a typical annealing cycle used in a GaAs MESFET fabrication process. FIG. 2 shows the optical transmission characteristics for both an as-grown (curve 20) and annealed sample (curve 21) fabricated in accordance with the structure of FIG. 1 when the incident light was perpendicular to the surface. The two transmission curves are almost identical, indicating that no change occurs in the optical absorption characteristics due to the annealing cycle. As illustrated in FIG. 2, approximately 50% of the incident light is absorbed in the $In_{0.42}Ga_{0.58}As$ layer at 1.3 μm.

Figure 3B:
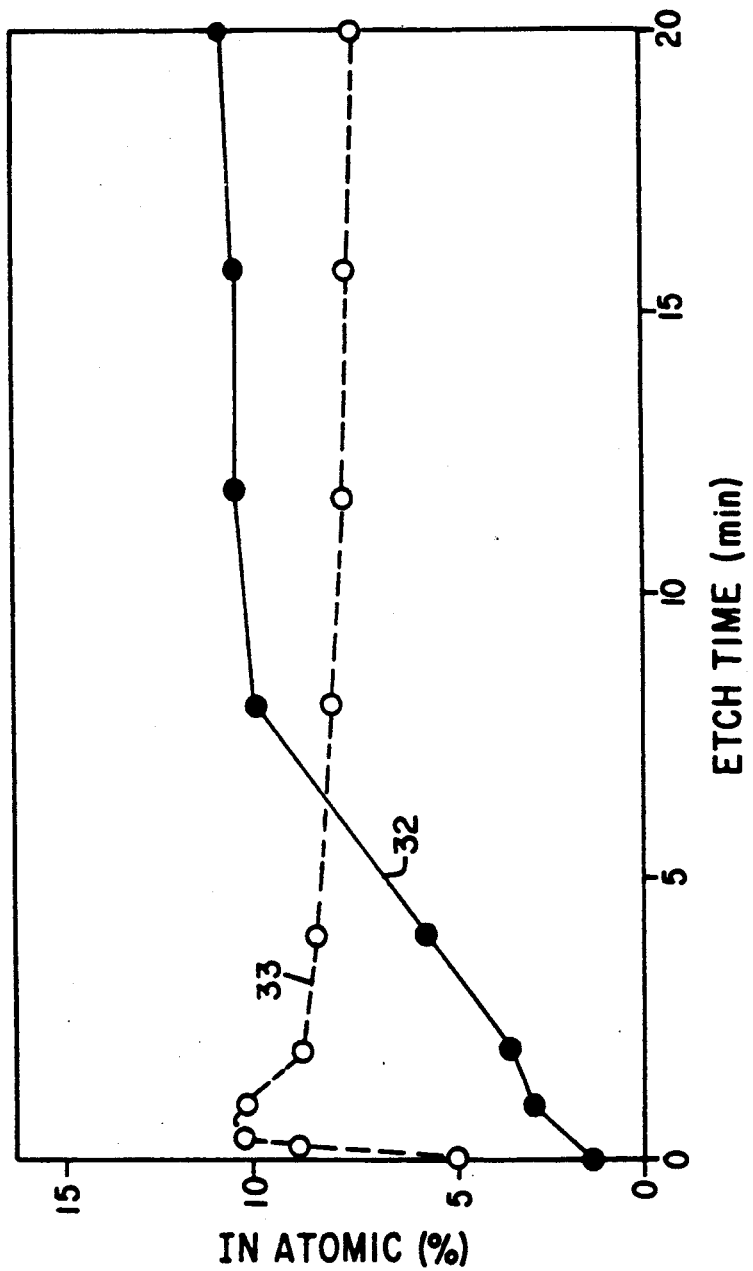
FIG. 3B shows the depth profile of atomic percent of indium for a prior art photodetector structure with graded GaAs cap layer before and after rapid thermal annealing.

Auger measurements were performed on the superlatticeenhanced sample of FIG. 1 before and after RTA up to a depth of ~1000Å to detect any change in the surface conditions after the annealing cycle. With reference to FIG. 3A, no traces of indium could be found at the surface of the sample either before or after the annealing cycle as indicated by curves 30 and 31, respectively, although some diffusion did occur after RTA. For comparison, a conventional photodetector structure with an ~500Å thick graded GaAs cap layer was also evaluated. FIG. 3B shows the Auger measurement for such an as-grown (curve 32) and annealed (curve 33) GaAs cap sample. Significant amounts of out-diffused indium were detected on the surface of these samples. It should be pointed out that even the as-grown sample does have ~1% indium at the surface. In order to achieve low dark currents for these conventional structures, an oxygen plasma passivation treatment was necessary to reduce the indium concentration at the surface. Disadvantageously, IMSM photodetectors fabricated on this conventional GaAs cap structure after RTA had high dark current, as will be described in the following section.

IMSM photodetectors were fabricated on both as-grown and annealed material structures of FIG. 1 by using a lift off process to pattern Ti/Pt/Au (200Å/200Å/1000Å) Schottky fingers on the superlattice 25. The fingers were 3.5 μm wide with a spacing of 3.5 μm and active region dimensions of 80×160 μm. Dark current versus bias voltage (I-V) curves for the as-grown and annealed material IMSM photo-detectors are shown in FIG. 4 as curves 40 and 41, respectively. The dark current of the IMSM photodetector fabricated on the as-grown material was ~7μA at a bias of 12 V. Photodetectors fabricated on heat treated material show an increased dark current, which is consistent with the diffusion of indium closer to the surface as shown in FIG. 3(A). Also shown as curve 42 in FIG. 4 is the I-V characteristic of a conventional IMSM photodetector fabricated on a graded GaAs cap layer after RTA. Although the dark currents of detectors fabricated on as-grown, graded GaAs cap material are comparable to those on the as-grown material structure of FIG. 1, serious degradation of the dark current in the conventional structure occurred due to the modification of the material induced by RTA (see FIG. 3(B)). The dc responsivities of the as-grown and annealed photodetectors of FIG. 1 biased at 12 V were typically between 0.15–0.18 A/W. The responsivity of one particular IMSM on as-grown material is 0.2 A/W (incident power of 50 μW) at a reverse bias of 13V with a concomitant dark current of 10 μA. A detector fabricated on the annealed material has the same responsivity and a dark current of 14 μA. By factoring in the loss of light due to finger shadowing (50%), the absorption of the material at 1.3 μm (50%), and the reflection loss (30%), the internal quantum efficiency of the photodetectors is estimated to be between 90 and 100%.

Figure 5:
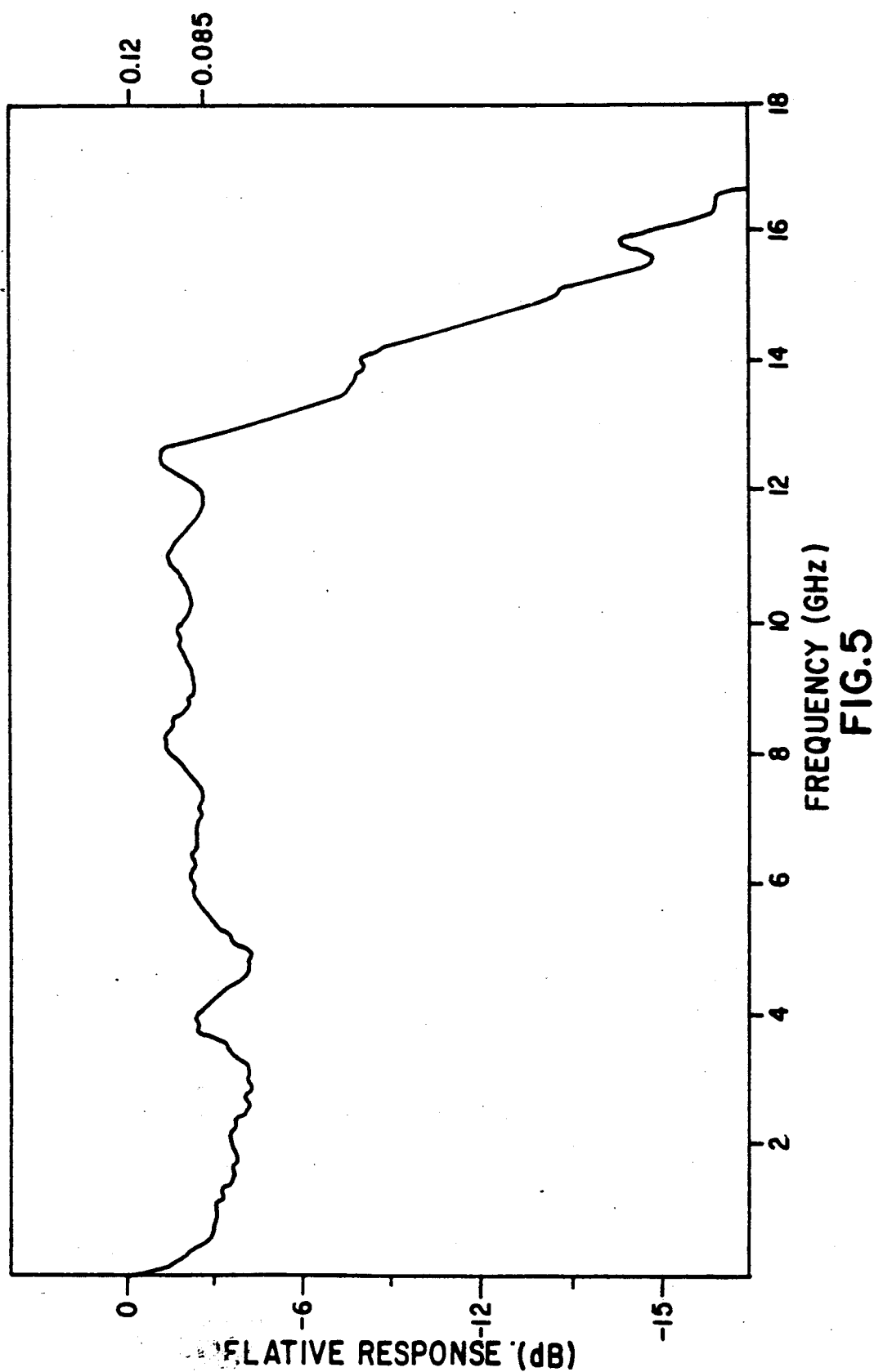
FIG. 5 shows the frequency response for the IMSM photodetector of FIG. 1 after thermal annealing.

The high frequency response, measured using an HP 8510 network analyzer, of the FIG. 1 photodetector fabricated on annealed material is shown in FIG. 5. The y-axis represents relative response in dB, while the x-axis is AC responsivity in A/W. A low-frequency roll-4, off at about 1.0 GHz is observed followed by a relatively flat response up to ~14 GHz. Photodetectors on as-grown material have very similar frequency responses. The ac responsivity in the flat region is ~0.085 A/W. The presence of the superlattice cap structure 25 is likely to increase the electron and hole lifetimes, thereby reducing the collection (quantum) efficiency at high frequency.

What has been shown and described herein is a new superlattice-enhanced photodetector structure in the InGaAs/GaAs material system. This structure represents the first demonstration of thermally stable, long wavelength material grown on GaAs substrates in which 1.3 μm IMSM photodetectors have been fabricated. Auger analysis of the structure revealed that the superlattice cap layer is capable of inhibiting the out-diffusion of indium to the surface during high-temperature annealing cycle, thus minimizing the degradation of the optical and electrical characteristics of the photodetectors fabricated on this material. Internal quantum efficiency and high-frequency bandwidth of the detectors are over 90% and 14 GHz, respectively. The stability of this IMSM structure to high temperature annealing offers the potential for fabrication of low cost, long-wavelength, monolithic receivers based on GaAs MESFET technology.

While there has been shown and described what are considered preferred embodiments of the present invention, it will be obvious to those skilled in the art that various changes and modifications may be made therein without departing from the invention as defined by the appended claims. For example, photodetector structures with other suitable material systems can be fabricated, the stoichiometries of the materials may be varied as is well known to those skilled in the art, and the thickness dimensions of the layers and the superlattice period counts may likewise be varied.

What is claimed is:

1. A photodetector structure, comprising:
   a substrate;
   a buffer region grown on said substrate and including in sequence a first semiconducting layer, a first superlattice structure, and a second semiconducting layer;
   an optically active absorbing layer grown on said second semiconducting layer;
   a second superlattice structure grown on said absorbing layer; and
   an interdigitated pattern of metal Schottky contacts fabricated on said second superlattice structure.

2. A photodetector structure, comprising:
   a GaAs substrate;
   a buffer region grown on said substrate and including in sequence a first layer of $In_{x_1}Ga_{1-x_1}As$, an $In_{x_2}Ga_{1-x_2}As$/GaAs superlattice, and a second layer of $In_{x_1}Ga_{1-x_1}As$;
   an optically cative absorbing layer of $In_xGa_{1-x}As$ grown on said second layer of $In_{x_1}Ga_{1-x_1}As$;
   an $Al_yGa_{1-y}As$/GaAs superlattice grown on said absorbing layer; and
   an interdigitated pattern of Schottky metal contacts fabricated on said $Al_yGa_{1-y}As$/GaAs superlattice.

3. The photodetector structure as recited in claim 2 wherein $x_1 < x < xhd\ 2$.

4. The photodetector structure as recited in claim 3 wherein
   $x_1 = 0.23$, $x_2 = 0.46$, $x = 0.42$, and $y = 0.3$;
   said buffer region is approximately 0.5 μm thick and said absorbing layer is approximately 1 μm thick;
   said $In_{x_2}Ga_{1-x_2}As$/GaAs superlattice includes n periods of alternating 10521-thick $In_{x_2}Ga_{1-x_2}As$ followed by 10Å-thick GaAs; and
   said $Al_yGa_{1-y}As$/GaAs superlattice includes m periods of alternating 25Å-thick $Al_yGa_{1-y}As$ followed by 25Å-thick GaAs wherein the upper layer of GaAs is 50Å-thick.

5. The photodetector structure as recited in claim 4 wherein $n = 20$ and $m = 10$.

6. A photodetector structure having a set of as-grown optical and electrical properties, comprising:
   a GaAs substrate;
   a buffer region grown on said substrate and including in sequence a first layer of $In_{x_1}Ga_{1-x_1}As$, an $In_{x_2}Ga_{1-x_2}As$/GaAs superlattice, and a second layer of $In_{x_1}Ga_{1-x_1}As$;
   an optically cative absorbing layer of $In\ Ga_{1-x}As$ grown on said second layer of $In_{x_1}Ga_{1-x_1}As$;
   an $Al_yGa_{1-y}As$/GaAs superlattice grown on said absorbing layer; and
   an interdigitated pattern of Schottky metal contacts fabricated on said $Al_yGa_{1-y}As$/GaAs superlattice;
   whereby said optical and electrical properties remain substantially unchanged after said phototector is subjected to a rapid thermal annealing treatment.

7. The photodetector structure as recited in claim 6 wherein $x_1 < x < x_2$.

8. The photodetector structure as recited in claim 7 wherein
   $x_1 = 0.23$, $x_2 = 0.46$, $x = 0.42$ and $y = 0.3$;
   said buffer region is approximately 0.5 μm thick and said absorbing layer is approximately 1 μm thick;
   said $In_{x_2}Ga_{1-x_2}As$/GaAs superlattice includes n periods of alternating 10Å-thick $In_{x_2}Ga_{1-x_2}As$ followed by 10Å-thick GaAs; and
   said $Al_yGa_{1-y}As$/GaAs superlattice includes m periods of alternating 25Å-thick $Al_yGa_{1-y}As$ followed by 25Å-thick GaAs wherein the upper layer of GaAs is 50Å-thick.

9. The photodetector structure as recited in claim 8 wherein $n = 20$ and $m = 10$.

* * * * *